United States Patent
Lin et al.

(10) Patent No.: US 7,950,524 B2
(45) Date of Patent: May 31, 2011

(54) WAFER CONTAINER HAVING THE PURGING VALVE

(75) Inventors: Chin-Ming Lin, Shulin (TW); Pao-Yi Lu, Shulin (TW)

(73) Assignee: Gudeng Precision Industrial Co., Ltd, Taipei (TW)

( * ) Notice: Subject to any disclaimer, the term of this patent is extended or adjusted under 35 U.S.C. 154(b) by 218 days.

(21) Appl. No.: 12/431,071

(22) Filed: Apr. 28, 2009

(65) Prior Publication Data
US 2010/0163452 A1  Jul. 1, 2010

(30) Foreign Application Priority Data
Dec. 26, 2008 (TW) ................................ 97150796 A (51) Int. Cl.
*B65D 85/90* (2006.01)
(52) U.S. Cl. ............ 206/711; 118/715; 141/89; 141/98; 220/745
(58) Field of Classification Search .......... 206/454–456, 206/710, 711, 832; 118/500, 715; 137/511, 137/843, 846; 141/63, 69, 85, 89, 98, 325; 220/367.1, 371, 745; 414/217, 935, 940
See application file for complete search history.

(56) References Cited

U.S. PATENT DOCUMENTS

| | | | |
|---|---|---|---|
| 4,532,970 A | 8/1985 | Tullis et al. | |
| 4,534,389 A | 8/1985 | Tullis et al. | |
| 5,320,218 A * | 6/1994 | Yamashita et al. | 206/454 |
| 5,755,332 A * | 5/1998 | Holliday et al. | 206/711 |
| 6,042,651 A * | 3/2000 | Roberson et al. | 118/715 |
| 7,201,276 B2 * | 4/2007 | Burns et al. | 206/710 |
| 7,328,727 B2 * | 2/2008 | Tieben et al. | 141/89 |
| 7,866,480 B2 * | 1/2011 | Burns et al. | 206/711 |
| 2003/0047562 A1 * | 3/2003 | Wu et al. | 220/371 |
| 2005/0077204 A1 * | 4/2005 | Sumi et al. | 206/710 |

* cited by examiner

*Primary Examiner* — Luan K Bui
(74) *Attorney, Agent, or Firm* — Ming Chow; Sinorica, LLC (57) ABSTRACT

A wafer container includes a container body, a door, and a purging valve, wherein the purging valve is disposed in the through hole of the container body. The purging valve includes a fixed sleeve body, a purging head, an elastic component, and a valve lid. The fixed sleeve body comprises a base, and a lower opening is formed at the center of the base for the purging head to be disposed therein. The purging head comprises a bottom portion and a hollow sleeve portion protruding upward from the bottom portion, wherein the hollow sleeve portion is surroundingly disposed with elastic component and with vent disposed on its circumference wall. The valve lid is disposed on top of the hollow sleeve portion so that the purging head can move from the first position to the second position inside the fixed sleeve body when being propped up by an upward force.

11 Claims, 13 Drawing Sheets

WAFER CONTAINER HAVING THE PURGING VALVE

BACKGROUND OF THE INVENTION

1. Field of the Invention

The present field of the invention is related to a front opening unified pod, and more particularly, to a front opening unified pod disposed with purging valve.

2. Description of the Prior Art

At present, most storage and transport devices for wafer and photomask used in semiconductor plants meet the requirements of Standard Mechanical Interface (SMIF) system proposed by Hewlett-Packard Company. This SMIF system has been disclosed in U.S. Pat. No. 4,532,970 and U.S. Pat. No. 4,534,389. The objective of the SMIF system is to ensure that in the process of transporting and storing wafer and photomask, gas surrounding wafer and photomask is static in relation to wafer and photomask, and also to prevent particles in the clean room from entering the environment adjacent to wafer and photomask.

Therefore, containers for transportation used in SMIF system are required to be equipped with property of good air tightness to prevent gas or particles of external environment from entering the containers for transportation. And in practice, take 200 mm wafer container or 300 mm wafer container for example, in order to prevent oxidization or organic contamination from occurring on the surface of wafer, gases such as nitrogen, inert gas, and dehydrated dry gas (moisture content lower than 1%) will be further conducted into the wafer container. In view of this, at least a purging valve is disposed in the aforementioned wafer containers to ensure the gas is smoothly purged and to prevent the purged gas in the wafer containers from leaking.

Figure 1:
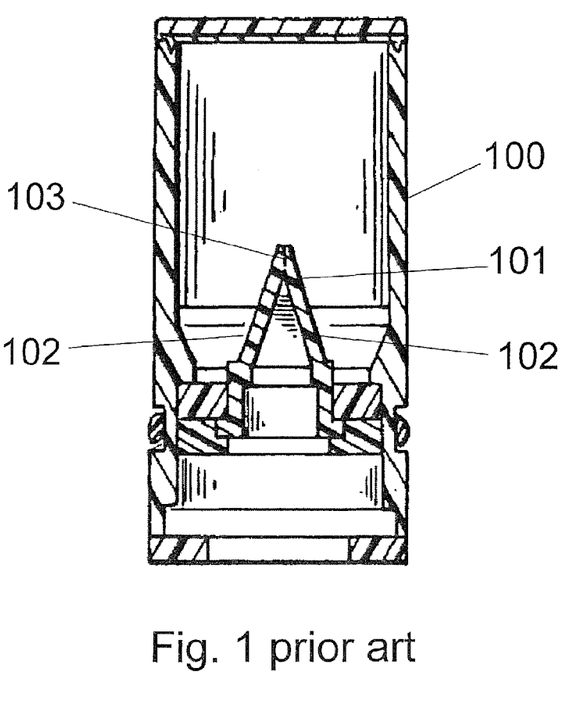
FIG. 1 is a view of purging valve of wafer container of the prior art.

Referring to FIG. 1, in which is purging valve used in wafer container disclosed in U.S. Pat. No. 7,201,276. This purging valve comprises a sleeve 100, in the interior of which is disposed with a duckbill valve body 101 consisting of two pieces of elastic flaps 102. Therefore, in the purging process, gas exerts pressure outside the flaps 102 and causes slot 103 between flaps 102 to expand for gas to smoothly enter the wafer container. When the purging is stopped or when the pressure in the interior of wafer container gradually increases, the slot 103 between flaps 102 resume to status of closure to retain gas in the interior of wafer container. The structure of the aforementioned purging valve is simple, but the design of flaps 102 and the materials used are not easily accessible. When the rigidity of material is too high, the flaps 102 do not deform easily and thus the slot 103 between flaps 102 is too small for the wafer container to be filled with gas in a short time. And when the rigidity of material is too low, the slot 103 between the flaps 102 cannot completely close and thus causes leakage of gas.

SUMMARY OF THE INVENTION

In view of the drawbacks of wafer container according to prior art that gas leaks easily from the purging valve and the purging valve cannot efficiently fill the wafer container with gas, one main objective of the present invention is to provide a purging valve used in wafer container that fills wafer container with gas in a short time to save time needed for purging gas.

Another main objective of the present invention is to provide a purging valve used in wafer container that retains gas in wafer container for a long duration of time and prevents gas in wafer container from leaking.

Still another main objective of the present invention is to provide a purging valve used in wafer container that is equipped with property of good air tightness to prevent gas outside wafer container or in the surrounding environment from entering wafer container in the purging process.

To achieve the aforementioned objectives, the present invention discloses a purging valve, mainly comprising a fixed sleeve body, a purging head, an elastic component, and a valve lid. The fixed sleeve body comprises a base and a lower opening is formed at the center of the base. The purging head comprises a bottom portion and a hollow sleeve portion protruding upward from the center of the bottom portion, wherein the hollow sleeve portion is located in the lower opening of the fixed sleeve body and a vent is disposed on the circumference wall of the hollow sleeve portion. The elastic component is surroundingly disposed around the hollow sleeve portion and located between the base of the fixed sleeve body and the bottom portion of the purging head. The valve lid is disposed on top of the hollow sleeve portion of the purging head so that the purging head can move from a first position to a second position inside the fixed sleeve body when being propped up by an upward external force. The aforementioned first position refers to that the valve lid presses the base of the fixed sleeve body, and the aforementioned second position refers to that a gap is formed between the valve lid and the base and the gap communicates with the vent of the purging head.

Moreover, the present invention also discloses a wafer container disposed with the aforementioned purging valve, wherein when the purging valve is closed, i.e. at the first position, the elastic component of which can exert a force for the valve lid to press the base of the fixed sleeve body, and therefore gas can be retained in wafer container for a long duration of time and gas leakage can be efficiently avoided.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENTS

Figure 2:
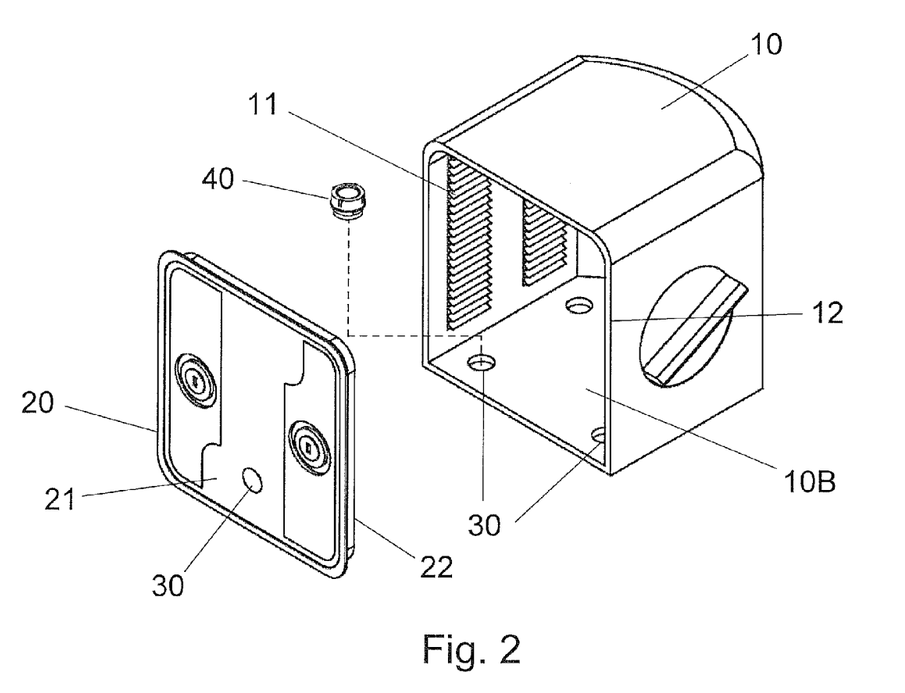
FIG. 2 is a view of a wafer container disposed with purging valve of the present invention.

In order to disclose the art applied in, objectives of, and effects achieved by the present invention in a more complete and clear manner, preferred embodiments are described as follows and drawings and signs are also disclosed for reference in the following:

First, referring to FIG. 2, which is a view of a wafer container of the present invention disposed with purging valve. This wafer container is a front opening unified pod and comprises a container body 10 and a door 20. In the container body 10 are disposed with a plurality of slots 11 for horizontally supporting a plurality of wafers, and on one sidewall of the container body 10 comprises an opening 12 provided for importing and exporting of wafers. The door 20 comprises an outer surface 21 and an inner surface 22, in which the door 20 is joined with the opening 12 of the container body 10 via inner surface 22 to protect the plurality of wafers within the container body 10. Moreover, on the container body 10 or the door 20 comprises at least a through hole 30 for disposing a purging valve 40. Generally speaking, the purging valve 40 is disposed on the base 10B of the container body 10, and thus when the wafer container is placed on a load port, a gas supply nozzle stretches out of the load port and purges the wafer container via the purging valve 40 in the through hole 30. Gas supplied or emitted by the aforementioned gas supply nozzle is mainly nitrogen, inert gas, or dry air, but is not particularly limited.

Figure 3:
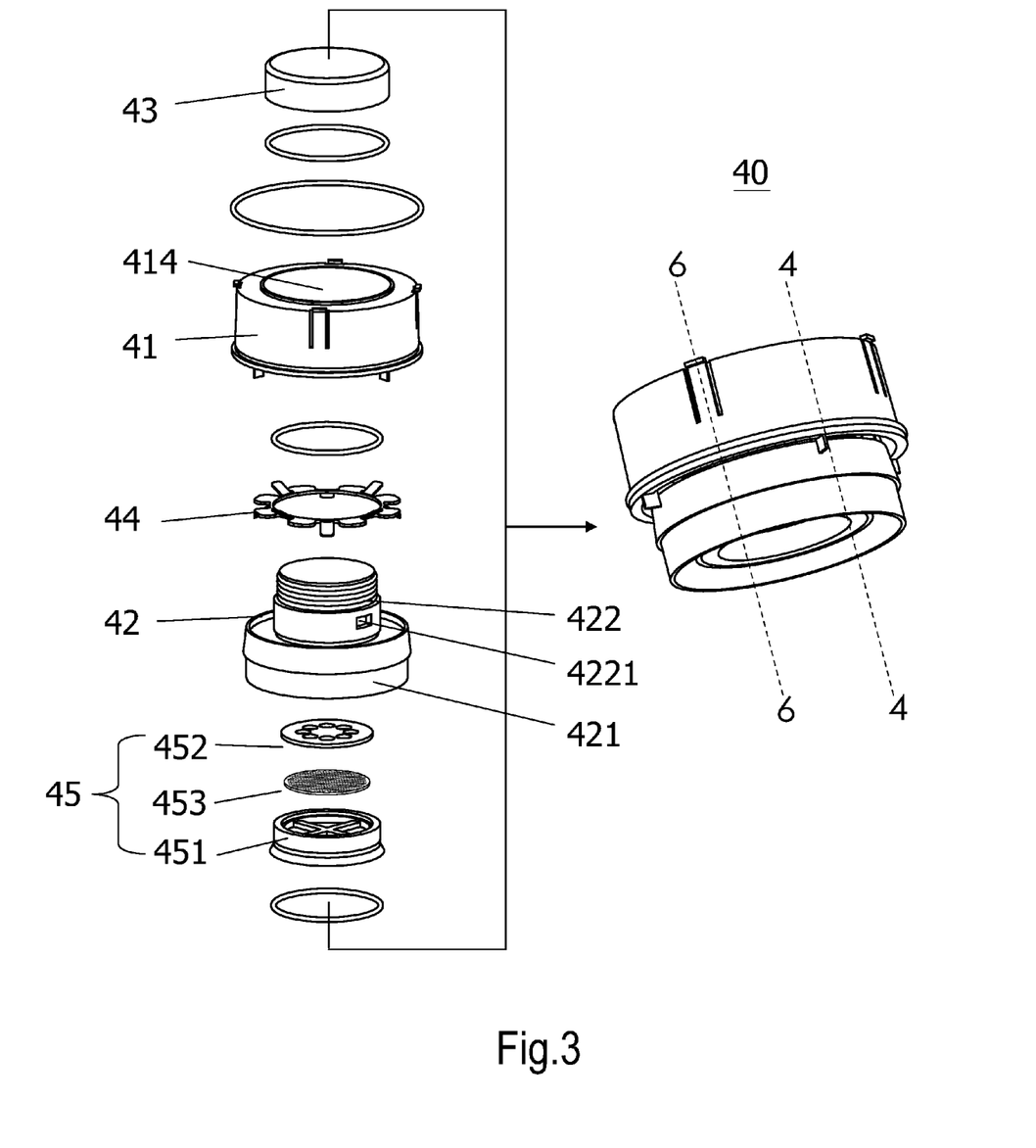
FIG. 3 is an explosive view of purging valve of wafer container of the present invention.

And as shown in FIG. 3, which is an explosive view of purging valve of wafer container of the present invention. The purging valve 40 mainly comprises a fixed sleeve body 41, a purging head 42, an elastic component 44, a valve lid 43, and a filter 45. The fixed sleeve body 41 is a sleeve structure with an upper opening 414 and a lower opening (not shown in Figure). The purging head 42 comprises a bottom portion 421 and a hollow sleeve portion 422 protruding upward from the center of the bottom portion 421. In the aforementioned purging head 42, an elastic component 44 is first surroundingly disposed around the hollow sleeve portion 422, the hollow sleeve portion 422 is then placed in the lower opening, and a valve lid 43 is immediately placed into the upper opening 414 and assembled or disposed on top of the hollow sleeve portion 422. The filter 45 comprises a lower lid 451, an upper lid 452, and a filter slice 453 and is disposed in the interior of bottom portion 421 of purging head 42. Therefore, when the gas supply nozzle purges the wafer container via the purging valve 40, the filter 45 can filter the gas emitted by the gas supply nozzle to ensure cleanliness in the interior of wafer container.

Figure 4:
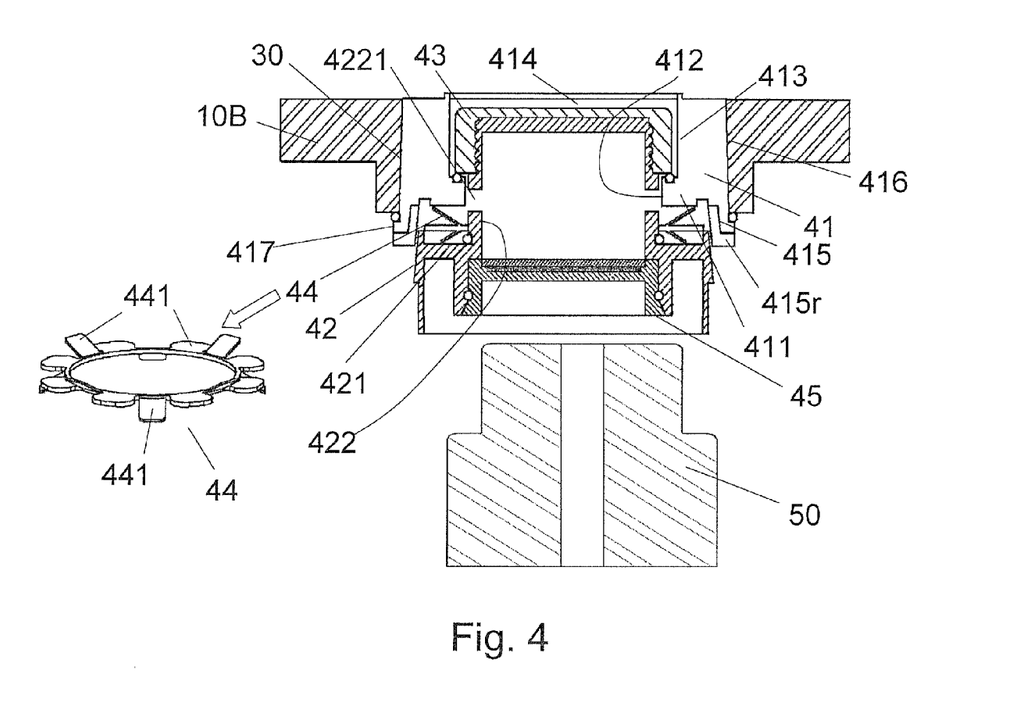
FIG. 4 is an 4-4 sectional view of purging valve in FIG. 3.
Figure 5A:
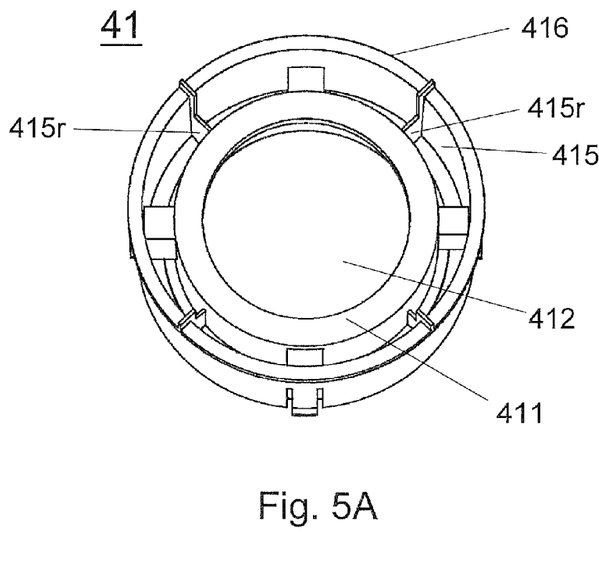
FIG. 5A is bottom view of fixed sleeve body of purging valve in FIG. 3.
Figure 5B:
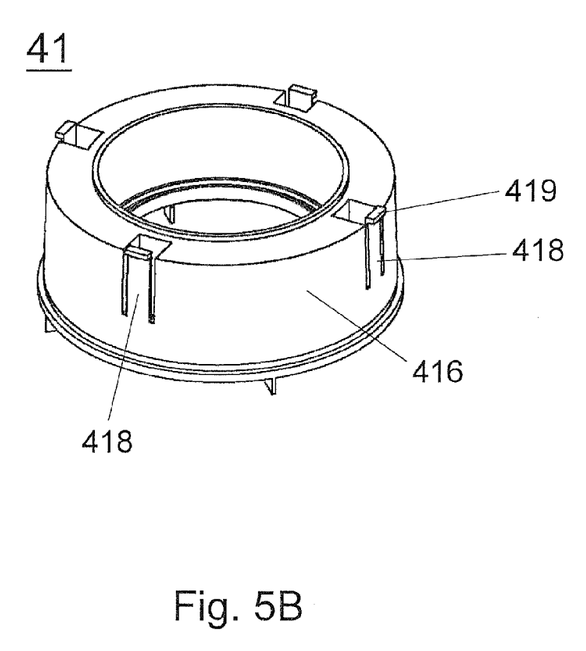
FIG. 5B is top view of fixed sleeve body of purging valve in FIG. 3.
Figure 6:
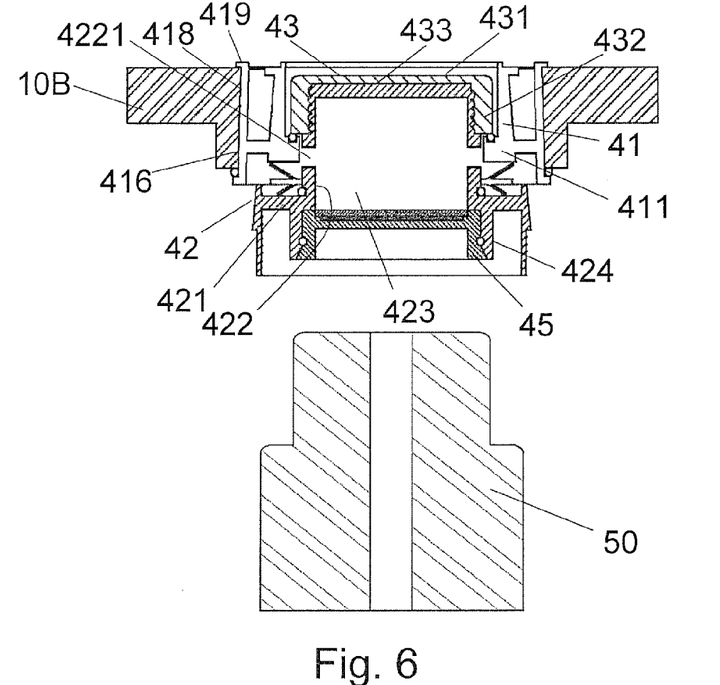
FIG. 6 is a 6-6 sectional view of purging valve in FIG. 3.

Then, referring to FIG. 4, which is an 4-4 sectional view of purging valve in FIG. 3; FIG. 5A and FIG. 5B are bottom view and top view of fixed sleeve body of purging valve in FIG. 3; FIG. 6 is a 6-6 sectional view of purging valve in FIG. 3. As shown in FIG. 4 (4-4 sectional view of purging valve), the fixed sleeve body 41 comprises a base 411 and at the center of the base 411 is disposed with the aforementioned lower opening 412. And a first inner sidewall 413 extends upward from the upper surface of the base 411, on the first inner sidewall 413 being formed an upper opening 414 with diameter larger than the lower opening 412. A second inner sidewall 415 extends downward from the lower surface of the base 411, and the aforementioned first inner sidewall 413 and second inner sidewall 415 further reverses outward to form outer circumference surface 416 of fixed sleeve body 41. The outer circumference surface 416 and the circumference rim of through hole 30 contact each other. And a protruding rim 417 extending outward is formed on the bottom of the outer circumference surface 416, the protruding rim 417 being fixed below the circumference rim of through hole 30 to prevent the fixed sleeve body 41 from entering into the interior of wafer container. And a seal element such as an O-ring can be further disposed between the aforementioned protruding rim 417 and the circumference rim of through hole 30 to prevent gas outside the wafer container from entering into the interior of the wafer container via the gap between the outer circumference surface 416 and the through hole 30. And as shown in FIG. 4, the elastic component 44 is a ring-shaped structure and a plurality of elastic projections 441 are connected around the ring-shaped structure, some elastic projections 441 extending upward whereas some directly extending outward or extending downward.

Moreover, as shown in FIG. 4 and FIG. 5A, a plurality of protruding ribs 415r are disposed on the second inner sidewall 415 of fixed sleeve body 41. The protruding ribs 415r are used to contact the bottom portion 421 of purging head 42 for the hollow sleeve portion 422 of the purging head 42 to be retained in the lower opening 412 of fixed sleeve body 41 for preventing the purging head 42 from swaying sideways inside the fixed sleeve body 41.

Then, referring to FIG. 5B and FIG. 6 (6-6 sectional view of purging valve), four cantilever snap fits 418 are disposed at intervals on the outer circumference surface 416. The cantilever snap fits 418 are connected to the outer circumference surface 416 at their bottom ends, and at their top ends another protruding rim 419 is further comprised. A gap exists between the structures of cantilever snap fits 418 (bottom ends as exception) and the fixed sleeve body 41, and therefore, the spring force of cantilever snap fits 418 can be used to fix the fixed sleeve body 41 in the through hole 30. Moreover, the protruding rims 419 at top ends of cantilever snap fits 418 can also be fixed on top of the circumference rim of through hole 30 to prevent the fixed sleeve body 41 from falling off to the exterior of wafer container.

Figure 7:
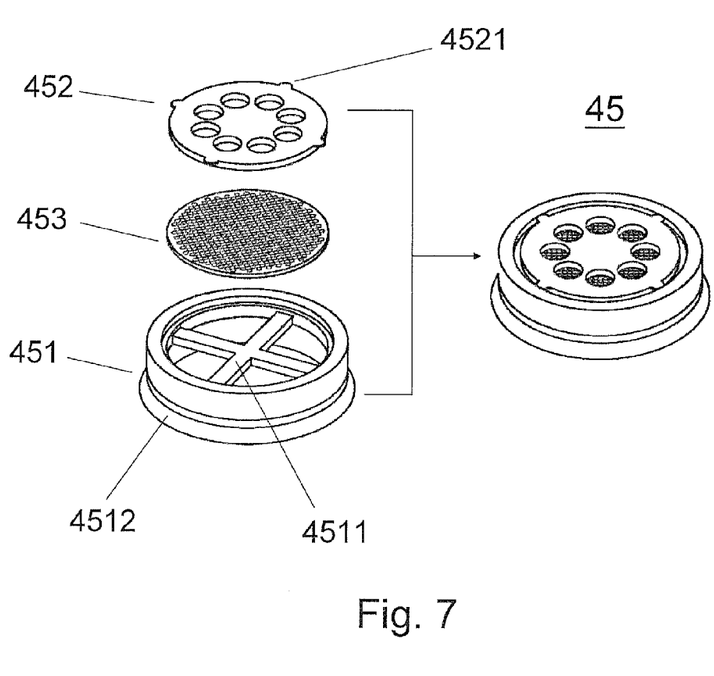
FIG. 7 is a view of filter of purging valve of the present invention.

And as shown in FIG. 4 and FIG. 6, one end of the hollow sleeve portion 422 of purging head 42 is closed and the other end is an open end (inlet 423 of purging head), and at least a vent 4221 is disposed on the circumference wall of the hollow sleeve portion 422. In addition, extending downward from the place of connection between the bottom portion 421 of purging head 42 and the inlet 423 of hollow sleeve portion 422 is a filter carrying portion 424. The sidewall of the filter carrying portion 424 can be disposed with screw threads or snap fit for the filter 45 to be installed. The filter 45, as above mentioned, consists of the lower lid 451, the upper lid 452, and the filter slice 453. As shown in FIG. 7, the lower lid 451 is a hollow structure, but this hollow structure is disposed with fastening ribs 4511 on which the filter slice 453 and the upper lid 452 are sequentially placed. Both the lower lid 451 and the upper lid 452 have holes, and therefore when the gas supply nozzle 50 purges the wafer container via the purging valve 40, gas purged can pass through holes and filter slice 453 and then enter the purging head 42. The upper lid 452 is with some elasticity and has protruding structure 4521 on its edge and can thus be embedded in the trough (not shown in Figure) on the sidewall of hollow structure of the lower lid 451. Since the upper lid 452 is removably fixed in the trough of the lower lid 451, when good filtering effect cannot be achieved due to the filter slice 453, only filter slice 453 needs to be replaced with new one. In addition, the bottom end of the lower lid 41 can be designed as a slant 4512 extending outward. On the slant 4512 can be disposed with a seal element such as an O-ring to prevent gas outside the wafer container from entering the purging head 42 or into the interior of wafer container via the gap between the slant 4512 and the filter carrying portion 424.

And as shown in FIG. 6, the valve lid 43 comprises a lid body 431 and extending downward from the circumference of lid body 431 is a lid rim 432. On the lid rim 432 is formed a lid recess 433 and on the sidewall of the lid recess 433 are disposed with screw threads to screw fit with the screw threads on the hollow sleeve portion 422 of purging head 42. And on the base 411 of the fixed sleeve body 41 opposite to the lid rim 432, i.e. at outer circumference of the lower opening 412, is disposed with a ring-shaped recess, in which a seal element such as an O-ring is embedded. Therefore when the gas supply nozzle 50 has not started to purge the wafer container, the purging valve 40 is in a status of closure. At this moment, the purging head 42 is at the first position, in other words, the lid rim 432 of valve lid 43 presses the O-ring on the base 411 of fixed sleeve body 41 to achieve air tightness. Thus gas outside the wafer container is not able to enter into the interior of wafer container via the vent 4221 on the hollow sleeve portion 422 of purging head 42. Of course, the recess and the O-ring are not required to be disposed in the base 411 of the aforementioned fixed sleeve body 41, and an alternative can be to cover the base 411 of the fixed sleeve body 41 or the lid rim 432 of valve lid 43 with a layer of rubber pad or seal element.

Figure 8:
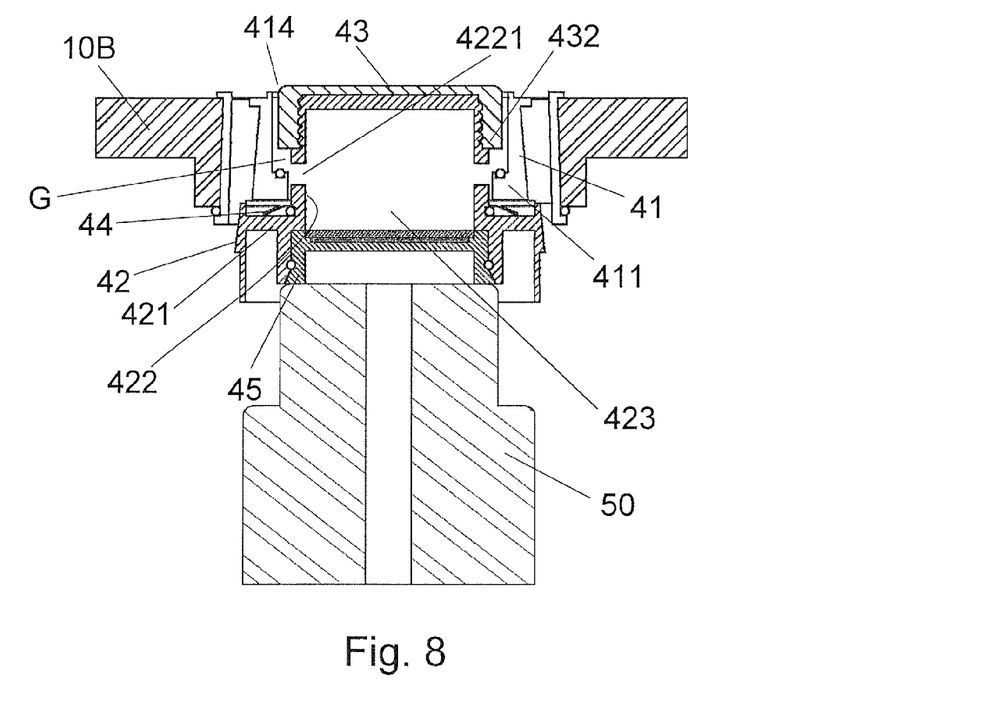
FIG. 8 is a sectional view of purging valve of wafer container of the present invention in the purging process.

Then, as shown in FIG. 8, which is a sectional view of purging valve of wafer container of the present invention in the purging process. When the gas supply nozzle 50 props up the purging head 42 or the filter 45 thereunder, the elastic component 44 and the elastic projections 441 are in a status of compression and the purging head 42 moves upward to the second position. The second position refers to that a gap G is formed between the lid rim 432 of valve lid 43 and the base 411 of fixed sleeve body 41. Meantime, the aforementioned gap G communicates with the vent 4221 of purging head 42; therefore gas emitted by the gas supply nozzle 50 can pass sequentially through the filter 45, the inlet 423 of purging head 42, the vent 4221 of purging head 42, the gap G, and the upper opening 414 of fixed sleeve body 41, and then enter into the interior of wafer container. When purging of wafer container is completed, the gas supply nozzle 50 is downwardly retrieved to be stopped from propping up the purging head 42; at this moment, the previously compressed elastic component 44 exerts its function by pushing the purging head 42 downward for air tightness to be re-achieved between the lid rim 432 of valve lid 43 and the base 411 of fixed sleeve body 41 for preventing gas inside the wafer container from leaking.

Figure 9:
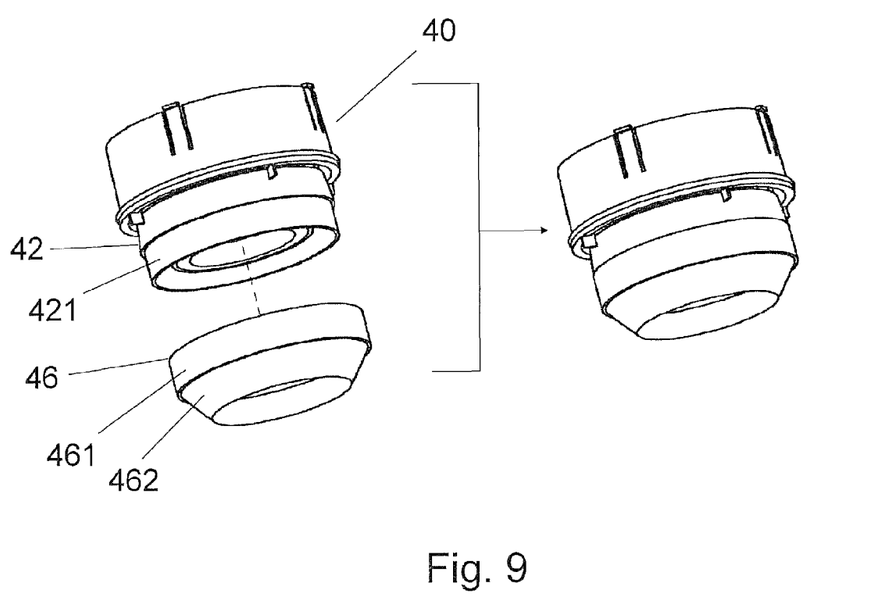
FIG. 9 is a view of purging valve of the present invention disposed with a joint piece.
Figure 10:
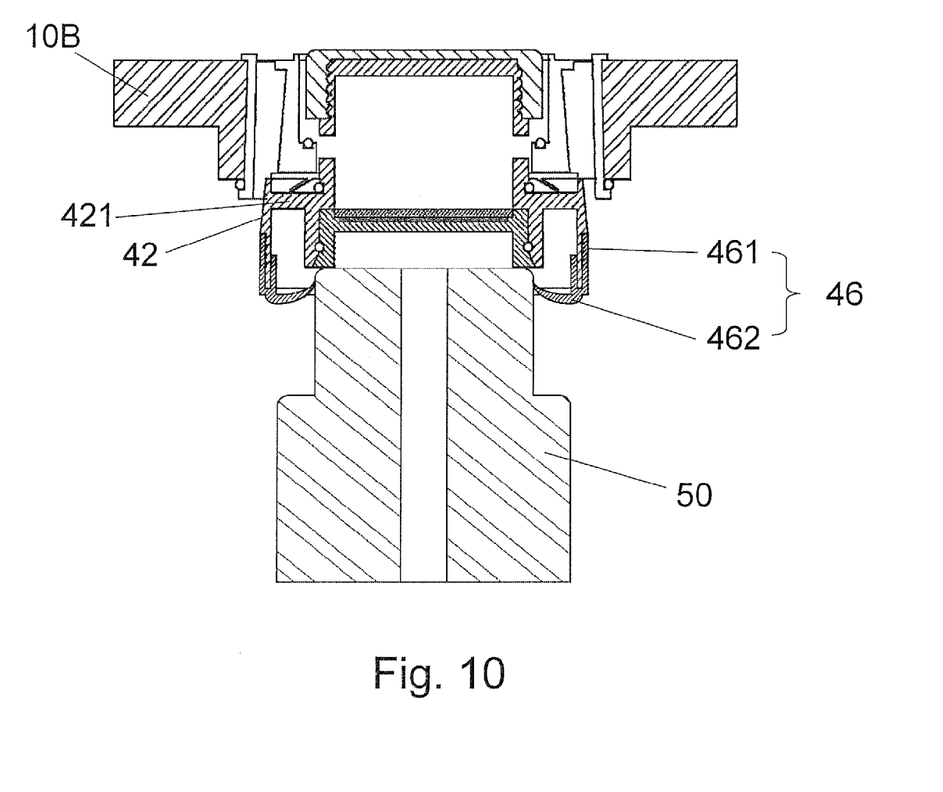
FIG. 10 is a sectional view of purging valve of the present invention disposed with a joint piece.
Figure 11:
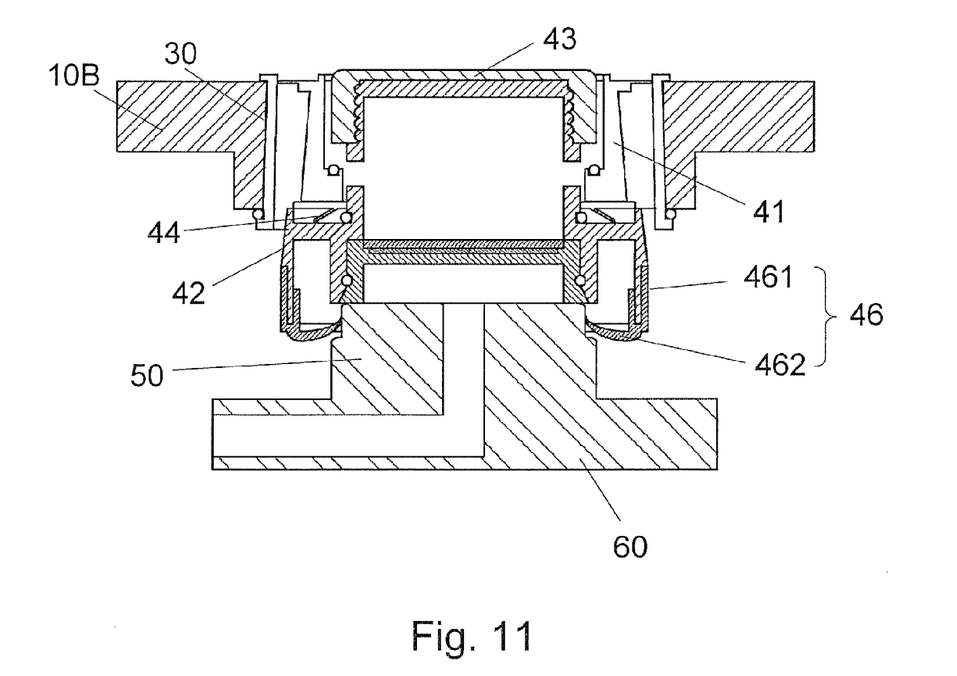
FIG. 11 is a sectional view of wafer container of the present invention on the load port in the process of being purged.

Then, referring to FIG. 9 and FIG. 10, a joint piece 46 can be further disposed at the bottom end of outer circumference surface of bottom portion 421 of purging head 42. The joint piece 46 comprises a ring-shaped sleeve 461 with a slant seal piece 462 extending from lower rim of the ring-shaped sleeve 461 toward the center. Therefore, when the aforementioned gas supply nozzle 50 props up the purging head 42, the seal piece 462 can prevent gas outside the wafer container or in the surrounding environment from entering into the interior of purging head 42 and thus ensure cleanliness of the interior of wafer container. And as shown in FIG. 11, the gas supply nozzle 50 is fixed on the load port 60 instead of being designed as movable or extendable from the load port 60. Therefore, once the wafer container is placed on the load port 60, the purging valve 40 in the through hole 30 of the wafer container opens, and the gas supply nozzle 50 on the load port 60 can immediately start purging to save time needed for purging. And once the wafer container leaves the load port 60, the elastic component 44 can push the purging head 42 downward for air tightness to be achieved between the valve lid 43 and the base 411 of fixed sleeve body 41.

Figure 12:
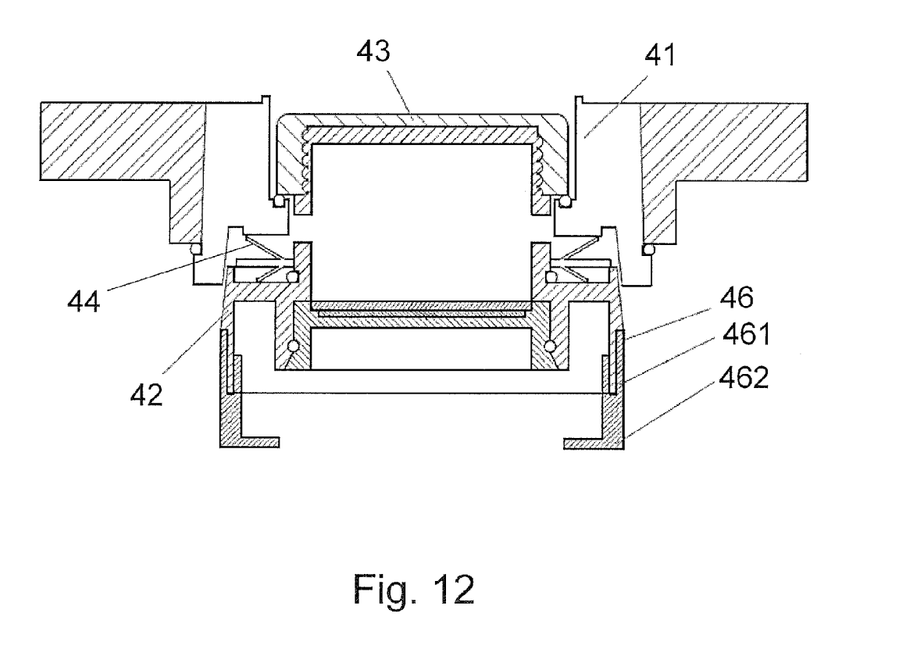
FIG. 12 is a sectional view of purging valve of the present invention disposed with another joint piece.

Of course, the aforementioned joint piece 46 disposed at the bottom end of purging head 42 can also have structure as shown in FIG. 12. The seal piece 462 of this joint piece 46 is horizontal instead of slant. Such seal piece 462 can still restrict gas outside wafer container or gas in the surrounding environment from entering into the interior of purging head 42. The present invention is wafer container disposed with purging valve 40; in addition, the present invention can also be purging valve 40 in itself. A preferred embodiment of purging valve 40 comprises fixed sleeve body 41, purging head 42, valve lid 43, elastic component 44, and filter 45. However, a purging valve 40 without elastic component 44 and filter 45 still allows the purging head 42 to move up and down between two different positions to complete purging process, although with inferior purging effect. Therefore, the purging valve 40 of the present invention can also be comprising only fixed sleeve body 41, purging head 42, and valve lid 43. Moreover, the purging head 42 can also be including only hollow sleeve portion 422 and without bottom portion 421; with such structure, the gas supply nozzle 50 can still prop up the purging head 42 for the vent 4221 of hollow sleeve portion 422 to communicate with the gap G.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A wafer container, comprising a container body, a plurality of wafers being placed in said container body and an opening being formed on one sidewall of said container body for importing and exporting said plurality of wafers, a door for closing said opening of said container body, and a purging valve disposed in a through hole on said container body, wherein the characteristic of said wafer container is in that:

said purging valve comprises a fixed sleeve body disposed in said through hole, said fixed sleeve body comprises a base with a lower opening formed at center of said base for a purging head to be installed therein, and said purging head has a vent disposed on its circumference wall, a valve lid being further disposed on top of said purging head for said purging head to move from a first position to a second position in said lower opening when being propped up by an upward external force; when said purging head being at said first position, said valve lid pressing said base of said fixed sleeve portion, and when said purging head being at said second position, a gap being formed between said valve lid and said base and said vent of said purging head communicating with said gap.

2. A wafer container, comprising a container body, a plurality of wafers being placed in said container body and an opening being formed on one sidewall of said container body for importing and exporting said plurality of wafers, a door for closing said opening of said container body, and a purging valve, said purging valve being disposed in a through hole on said container body, wherein the characteristic of said wafer container is in that:

said purging valve comprises a fixed sleeve body disposed in said through hole, said fixed sleeve body comprises a base with a lower opening formed at center of said base for a purging head to be installed therein, and said purging head comprises a bottom portion and a hollow sleeve portion protruding upward from center of said bottom portion, said hollow sleeve portion being surroundingly disposed with an elastic component and a vent being disposed on its circumference wall, a valve lid being further disposed on top of said hollow sleeve portion for said purging head to move from a first position to a second position inside said fixed sleeve body and to compress said elastic component when being propped up by an upward external force; when said purging head being at said first position, said valve lid pressing said base of said fixed sleeve portion, and when said purging head being at said second position, a gap being formed between said valve lid and said base and said vent of said purging head communicating with said gap.

3. The wafer container according to claim 2, wherein said elastic component is a ring-shaped structure and a plurality of elastic projections being connected around said ring-shaped structure.

4. The wafer container according to claim 3, wherein said plurality of elastic projections of said elastic component consist of at least an elastic projection extending upward and at least an elastic projection extending downward.

5. The wafer container according to claim 2, wherein said elastic component is located between said bottom portion of said purging head and said base of said fixed sleeve body.

6. The wafer container according to claim 2, wherein said bottom portion of said purging head includes an inlet.

7. The wafer container according to claim 6, wherein said inlet of said purging head is further installed with a filter, and when said filter props up via a gas supply nozzle, said purging head moves from said first position to said second position.

8. The wafer container according to claim 2, wherein said bottom portion of said purging head is further disposed with a joint piece.

9. The wafer container according to claim 2, wherein said fixed sleeve body includes an outer circumference surface, and a plurality of cantilever snap fits are disposed at intervals on said outer circumference surface.

10. The wafer container according to claim 9, wherein an inner sidewall extends downward from circumference of said base of said fixed sleeve body and reverses to form said outer circumference surface and said inner sidewall is used for placing said bottom portion of said purging head.

11. The wafer container according to claim 10, wherein a plurality of protruding ribs are further disposed on said inner sidewall of said fixed sleeve body, said plurality of protruding ribs being used for contacting said bottom portion of said purging head for said hollow sleeve portion of said purging head to be retained in said lower opening of said fixed sleeve body.

* * * * *